United States Patent
Park et al.

(10) Patent No.: US 10,522,370 B2
(45) Date of Patent: Dec. 31, 2019

(54) SUBSTRATE PROCESSING APPARATUS

(71) Applicant: SAMSUNG ELECTRONICS CO., LTD., Suwon-si, Gyeonggi-Do (KR)

(72) Inventors: Sang-Hyun Park, Yongin-si (KR); Kazuya Ono, Suwon-si (KR); Jung Jae Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 251 days.

(21) Appl. No.: 15/481,686

(22) Filed: Apr. 7, 2017

(65) Prior Publication Data

US 2018/0076058 A1 Mar. 15, 2018

(30) Foreign Application Priority Data

Sep. 9, 2016 (KR) .................. 10-2016-0116436

(51) Int. Cl.
| | |
|---|---|
| *H01L 21/67* | (2006.01) |
| *G03F 7/20* | (2006.01) |
| *B08B 1/04* | (2006.01) |
| *B08B 3/02* | (2006.01) |

(52) U.S. Cl.
CPC .......... *H01L 21/67046* (2013.01); *B08B 1/04* (2013.01); *B08B 3/02* (2013.01); *G03F 7/70716* (2013.01); *G03F 7/70758* (2013.01); *H01L 21/67051* (2013.01); *B08B 2203/0288* (2013.01)

(58) Field of Classification Search
CPC .................. G03F 7/70716; G03F 7/70758
See application file for complete search history.

(56) References Cited

U.S. PATENT DOCUMENTS

| | | | |
|---|---|---|---|
| 4,952,858 A * | 8/1990 | Galburt | G03F 7/70716 |
| | | | 318/567 |
| 5,910,992 A | 6/1999 | Ho | |
| 6,252,370 B1 | 6/2001 | Ebihara et al. | |
| 6,285,437 B1 | 9/2001 | Tokunaga | |
| 6,359,679 B1 | 3/2002 | Ito et al. | |
| 6,628,391 B2 | 9/2003 | Hoover et al. | |
| 6,693,402 B2 | 2/2004 | Ebihara et al. | |
| 6,947,125 B2 | 9/2005 | Del Puerto | |
| 7,264,235 B2 | 9/2007 | Morisada | |
| 7,292,317 B2 | 11/2007 | Cox et al. | |
| 7,366,642 B2 | 4/2008 | Hsin et al. | |
| 7,586,598 B2 | 9/2009 | Plug et al. | |
| 7,649,613 B2 | 1/2010 | Butler | |

(Continued)

FOREIGN PATENT DOCUMENTS

| | | |
|---|---|---|
| JP | 2013-214691 | 10/2013 |
| KR | 10-2004-0012296 | 2/2004 |

(Continued)

*Primary Examiner* — Spencer E Bell
(74) *Attorney, Agent, or Firm* — F. Chau & Associates, LLC

(57) ABSTRACT

A substrate processing apparatus includes a substrate stage that supports a substrate, a follower stage disposed on a same plane as the substrate stage, a first driving unit that moves the follower stage in parallel with a first direction, and a second driving unit that moves the substrate stage in parallel with the first direction. The second driving unit includes a voice magnet member disposed on the substrate stage, and a voice coil member disposed on the follower stage and spaced apart from the voice magnet member.

12 Claims, 16 Drawing Sheets

(56) References Cited

U.S. PATENT DOCUMENTS

| | | | |
|---|---|---|---|
| RE41,232 E | 4/2010 | Hazelton et al. | |
| 7,804,582 B2 | 9/2010 | Zaal et al. | |
| 7,944,166 B2 | 5/2011 | Hosobata et al. | |
| 7,961,309 B2 | 6/2011 | Plug et al. | |
| 8,009,275 B2 | 8/2011 | Ono | |
| 8,139,219 B2 | 3/2012 | George | |
| 8,896,811 B2 | 11/2014 | Hol et al. | |
| 8,994,923 B2 | 3/2015 | Shibazaki | |
| 9,104,121 B2 | 8/2015 | Emoto et al. | |
| 2003/0169409 A1* | 9/2003 | Nishi | G03F 7/70716 355/51 |
| 2004/0252287 A1 | 12/2004 | Binnard et al. | |
| 2005/0057102 A1* | 3/2005 | Totsu | G03F 7/70758 310/12.06 |
| 2006/0017908 A1 | 1/2006 | Mayama | |
| 2008/0094604 A1* | 4/2008 | Shibazaki | G03F 7/70725 355/72 |
| 2017/0090303 A1* | 3/2017 | Johnston | G03F 7/709 |

FOREIGN PATENT DOCUMENTS

| | | |
|---|---|---|
| KR | 10-2005-0016029 | 2/2005 |
| KR | 10-2007-0115644 | 12/2007 |

* cited by examiner

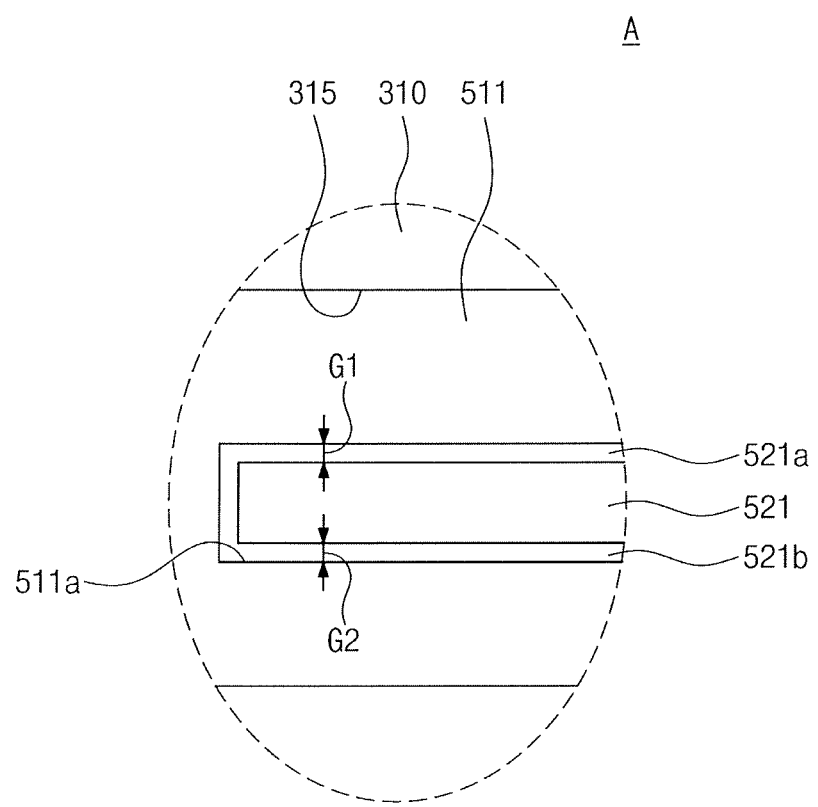

SUBSTRATE PROCESSING APPARATUS

CROSS-REFERENCE TO RELATED APPLICATION

This U.S. nonprovisional patent application claims priority under 35 U.S.C § 119 to Korean Patent Application 10-2016-0116436, filed in the Korean Intellectual Property Office on Sep. 9, 2016, the disclosure of which is incorporated by reference herein in its entirety.

TECHNICAL FIELD

The inventive concept relates to a substrate processing apparatus.

DISCUSSION OF THE RELATED ART

Fabrication of semiconductor devices or flat panel displays requires various processes such as ion implantation, deposition, diffusion, photolithography, etching, etc. The photolithography process may be employed to form patterns on a substrate and/or a wafer. The photolithography process may include coating a photoresist on the substrate and exposing the substrate to light to transfer a mask pattern on the photoresist coating. The photolithography process may further include developing and removing the photoresist from the substrate.

The exposure process may be performed by using a substrate processing apparatus. The substrate processing apparatus may include a moving stage unit that moves the substrate. The moving stage unit may move the substrate in first and second directions that cross each other during the fabrication process. Fine circuit patterns may be formed on the substrate that is moved by the moving stage unit. The location of the moving stage unit should be accurately controlled.

SUMMARY

According to an exemplary embodiment of the inventive concept, a substrate processing apparatus may block disturbance acting on a substrate stage from a follower stage.

According to an exemplary embodiment of the inventive concept, a substrate processing apparatus may remove reaction caused by movement of a substrate stage and a follower stage.

According to an exemplary embodiment of the inventive concept, a substrate processing apparatus includes a substrate stage that supports a substrate, a follower stage disposed on a same plane as the substrate stage, a first driving unit that moves the follower stage in parallel with a first direction, and a second driving unit that moves the substrate stage in parallel with the first direction. The second driving unit includes a voice magnet member disposed on the substrate stage, and a voice coil member disposed on the follower stage and spaced apart from the voice magnet member.

According to an exemplary embodiment of the inventive concept, a substrate processing apparatus includes a base frame, a gantry fixed to the base frame, and a moving stage unit that moves in parallel with a first direction between the base frame and the gantry. The moving stage unit includes a substrate stage that supports a substrate, a follower stage that is disposed on a same plane as the substrate stage and is not in contact with the substrate stage, a voice magnet member disposed on the substrate stage, a voice coil member disposed on the follower stage, wherein the voice coil member is exposed to a magnetic field produced by the voice magnet member such that the voice magnet member experiences a Lorentz force in parallel with the first direction, and a first driving unit that moves the follower stage in parallel with the first direction.

According to an exemplary embodiment of the inventive concept, a substrate processing apparatus includes a substrate stage that supports a substrate, wherein the substrate stage extends along a first plane formed by a first direction and a second direction, wherein the first and second directions cross each other, a follower stage disposed on the substrate stage and arranged substantially parallel to the first plane, a first driving unit that moves the follower stage in parallel with the first direction, and a second driving unit that moves the substrate stage in parallel with the first direction. The second driving unit includes a first magnet extending in the second direction and disposed on the substrate stage, wherein the first magnet includes a first groove extending in the second direction, and a first coil member fixed to the follower stage, wherein a portion of the first coil member is inserted in the first groove.

BRIEF DESCRIPTION OF THE DRAWINGS

The above and other features of the inventive concept will become more apparent by describing in detail exemplary embodiments thereof in conjunction with the accompanying drawings, in which:

FIG. 7B is an enlarged view of section A of FIG. 7A according to an exemplary embodiment of the inventive concept;

DETAILED DESCRIPTION OF THE EMBODIMENTS

Exemplary embodiments of the inventive concept will be described more fully hereinafter with reference to accompanying drawings.

Figure 1:
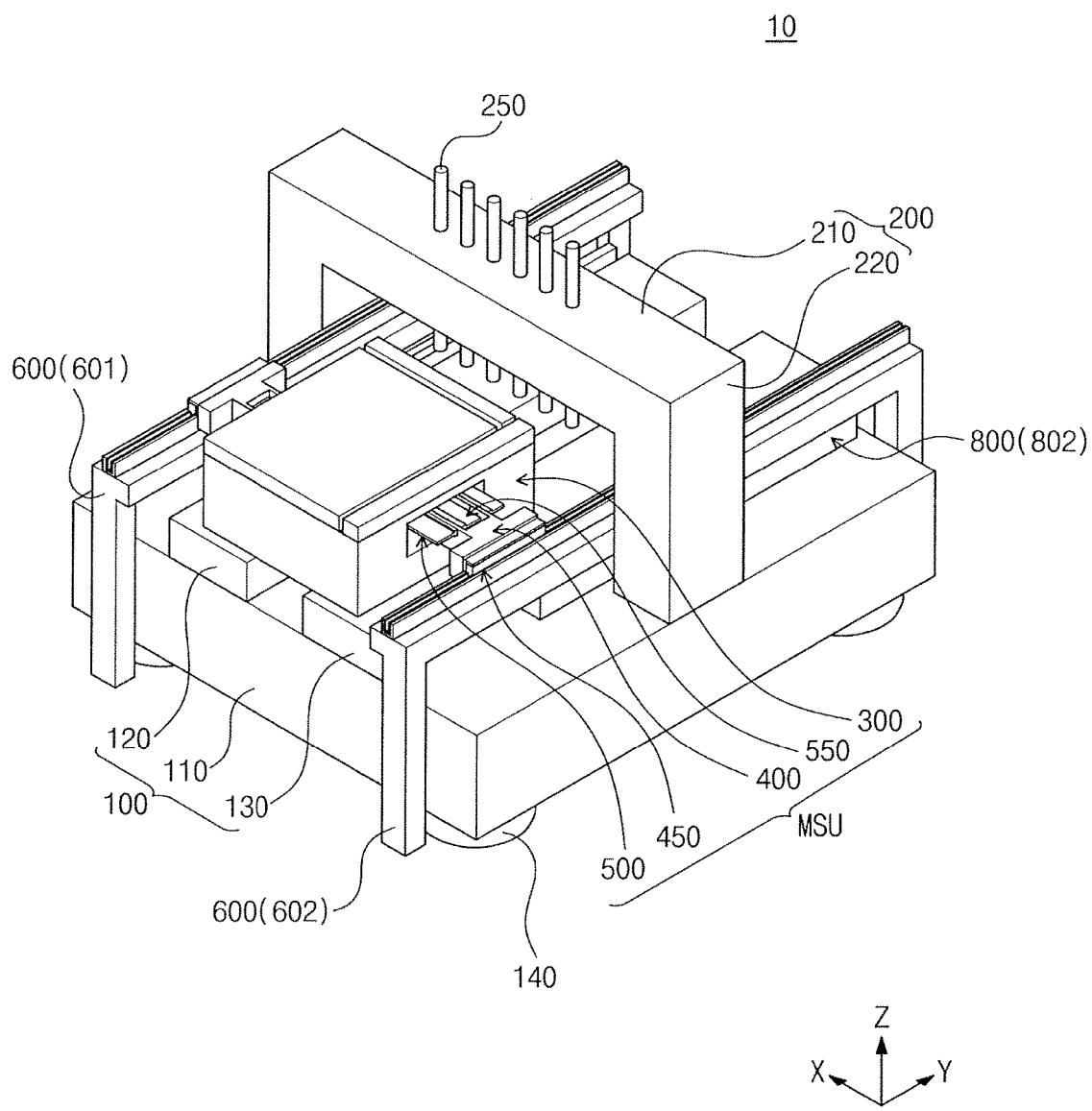
FIG. 1 is a perspective view illustrating a substrate processing apparatus according to an exemplary embodiment of the inventive concept.
Figure 2:
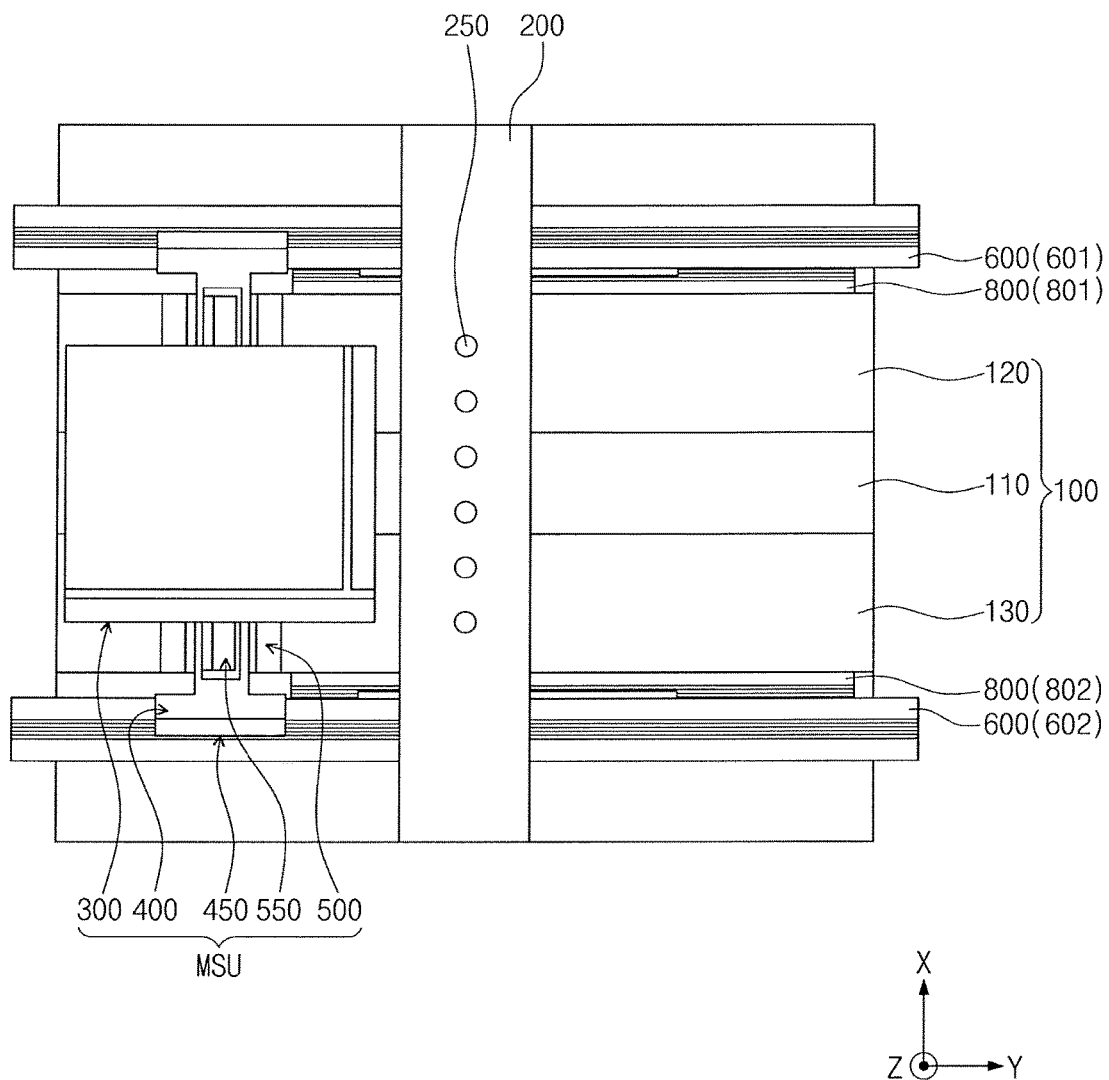
FIG. 2 is a plan view illustrating the substrate processing apparatus of FIG. 1 according to an exemplary embodiment of the inventive concept.
Figure 3:
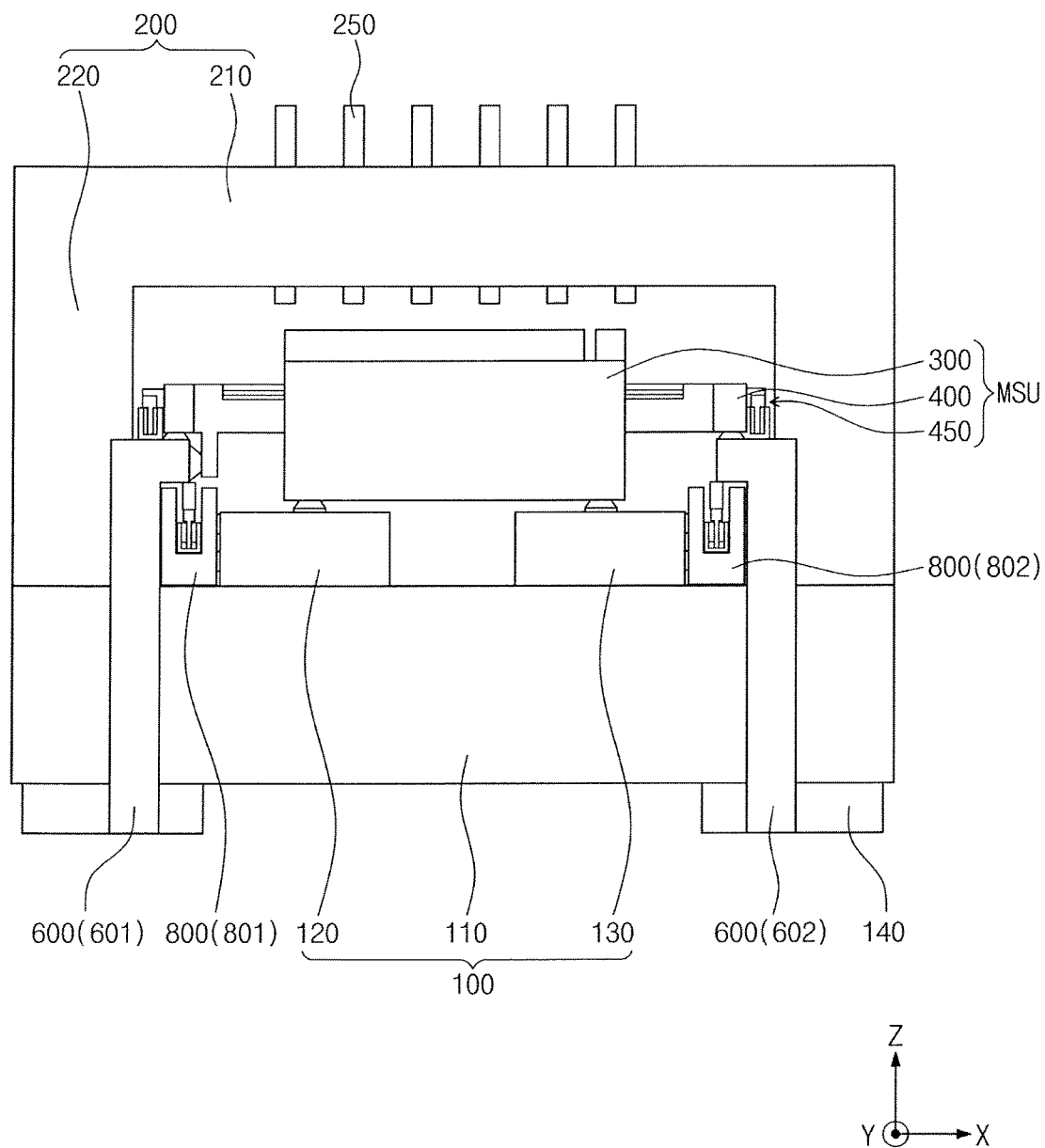
FIG. 3 is a front view illustrating the substrate processing apparatus of FIG. 1 according to an exemplary embodiment of the inventive concept.
Figure 4:
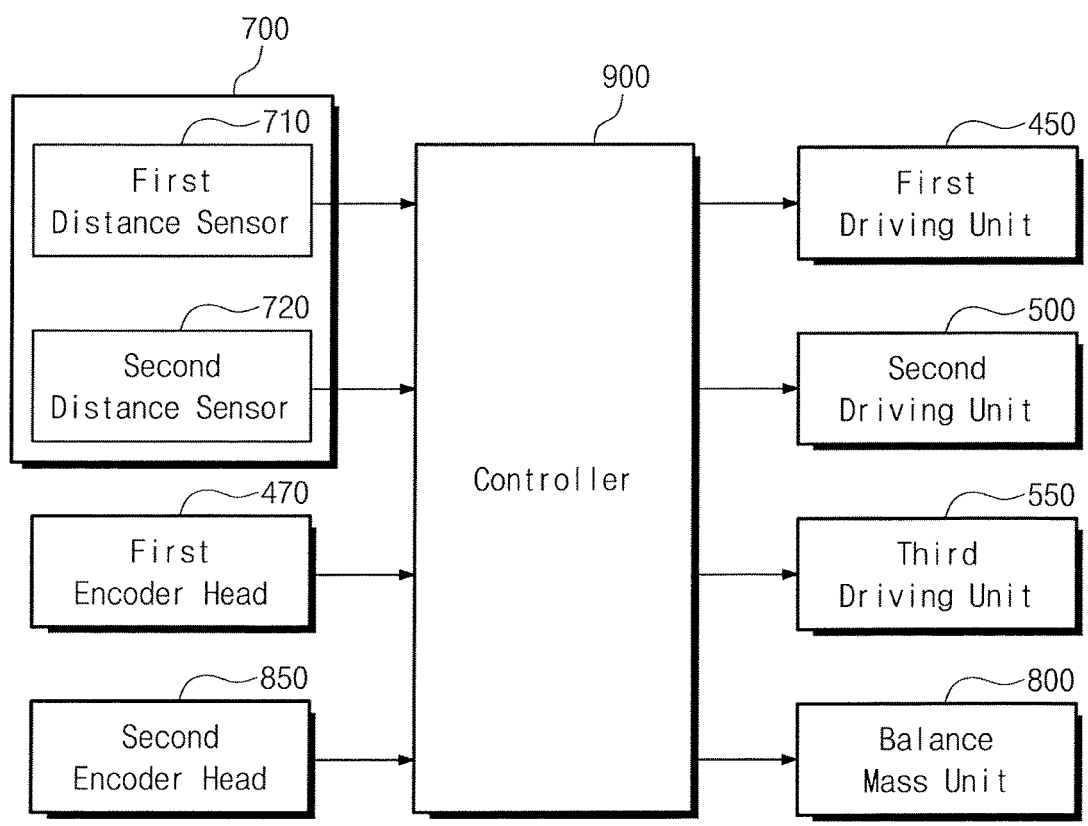
FIG. 4 is a block diagram illustrating the substrate processing apparatus of FIG. 1 according to an exemplary embodiment of the inventive concept.

FIG. 1 is a perspective view illustrating a substrate processing apparatus according to an exemplary embodiment of the inventive concept. FIG. 2 is a plan view illustrating the substrate processing apparatus of FIG. 1 according to an exemplary embodiment of the inventive concept. FIG. 3 is a front view illustrating the substrate processing apparatus of FIG. 1 according to an exemplary embodiment of the inventive concept. FIG. 4 is a block diagram illustrating the substrate processing apparatus of FIG. 1 according to an exemplary embodiment of the inventive concept.

Referring to FIGS. 1 to 4, a substrate processing apparatus 10 may be used to perform a substrate treatment process. In an exemplary embodiment of the inventive concept, the substrate processing apparatus 10 is an exposure apparatus that can be used to form a fine circuit pattern on a substrate. The substrate processing apparatus 10 may include a base frame 100, a gantry 200, an exposure light-source unit 250, a moving stage unit MSU, a guide frame unit 600, a distance sensor unit 700, a balance mass unit 800, and a controller 900.

The base frame 100 may support various components included in the substrate processing apparatus 10. For example, the various components may include the gantry 200, the exposure light-source unit 250, the moving stage unit MSU, the distance sensor unit 700, and the balance mass unit 800. The base frame 100 may include a lower base 110 and first and second upper bases 120 and 130 on the lower base 110. The first and second upper bases 120 and 130 may be elongated in a y-axis direction Y and be spaced apart from each other in an x-axis direction X crossing the y-axis direction Y.

A plurality of mounts 140 may be disposed below the lower base 110. The mounts 140 may be isolators and levels. However, the inventive concept is not limited thereto. As isolators, the mounts 140 may be used to control vibration of the substrate processing apparatus 10. As levels, the mounts 140 may be used to level the substrate processing apparatus 10.

The gantry 200 may be disposed above the base frame 100. The gantry 200 may include a pair of support members 220 that extend from the base frame 100 in a z-axis direction Z and an interconnect member 210 connected to the pair of support members 220. The z-axis direction Z crosses the x-axis direction X and the y-axis direction Y. The pair of support members 220 may be spaced apart from each other in the x-axis direction X. The interconnect member 210 may have a bar shape extending along the x-axis direction X. The interconnect member 210 may be spaced apart from the base frame 100 in the z-axis direction Z. Thus, a space may be provided between the interconnect member 210 and the base frame 100.

In an exemplary embodiment of the inventive concept, the z-axis direction Z may be an up-and-down direction, the y-axis direction Y may be a front-and-rear direction, and the x-axis direction X may be a left-and-right direction. However, the inventive concept is not limited thereto.

The exposure light-source unit 250 may be provided at the gantry 200. In an exemplary embodiment of the inventive concept, a plurality of exposure light-source units 250 may be provided in the interconnect member 210. The plurality of exposure light-source units 250 may be spaced apart from each other along the x-axis direction X. In an exemplary embodiment of the inventive concept, an exposure light-source unit 250 may have a cylindrical shape elongated in the z-axis direction Z, but the inventive concept is not limited thereto. The exposure light-source unit 250 may direct light for transferring a circuit pattern image onto a substrate in a photolithography process. In an exemplary embodiment of the inventive concept, a light-source unit 250 emits light.

The moving stage unit MSU may be configured to move between the base frame 100 and the interconnect member 210 of the gantry 200. The moving stage unit MSU may include a substrate stage 300, a follower stage 400, a first driving unit 450, a second driving unit 500, and a third driving unit 550.

The substrate stage 300 may support a substrate and/or a wafer placed on the substrate. The wafer and the substrate may be collectively referred to as a substrate. The second driving unit 500 may drive the substrate stage 300 to move the substrate stage 300 in the y-axis direction Y and the third driving unit 550 may drive the substrate stage 300 to move the substrate stage 300 in the x-axis direction X. The substrate stage 300 will be further discussed in detail below.

The first driving unit 450 may drive the follower stage 400 to move the follower stage 400 in the y-axis direction Y. The follower stage 400 may be disposed on the same plane as the substrate stage 300. In an exemplary embodiment of the inventive concept, the same plane on which the substrate stage 300 and the follower stage 400 are disposed may be an XY plane. The follower stage 400 may not be in contact with the substrate stage 300. The follower stage 400 may include a first encoder head 470. Alternatively, in an exemplary embodiment of the inventive concept, the first encoder head 470 may be provided on the first driving unit 450. The follower stage 400 will be further discussed in detail below.

The first driving unit 450 may drive the follower stage 400 to move the follower stage 400 in the y-axis direction Y, the second driving unit 500 may drive the substrate stage 300 to move the substrate stage 300 in the y-axis direction Y, and the third driving unit 550 may drive the substrate stage 300 to move the substrate stage 300 in the x-axis direction X.

The guide frame unit 600 may support the follower stage 400. In addition, the guide frame unit 600 may guide the movement of the follower stage 400. The guide frame unit 600 may include a first guide frame 601 and a second guide frame 602. The first and second guide frames 601 and 602 may be spaced apart from each other in the x-axis direction X. The first guide frame 601 may support a side of the follower stage 400, and the second guide frame 602 may support an opposite side of the follower stage 400. The guide frame unit 600 will be further discussed in detail below with reference to FIGS. 9 and 10.

The distance sensor unit 700 may include a first distance sensor 710 and a second distance sensor 720. In an exemplary embodiment of the inventive concept, the first and second distance sensors 710 and 720 may be, but are not limited to, laser sensors.

The first distance sensor 710 may measure a distance between the moving stage unit MSU and the first distance sensor 710 in the y-axis direction Y. The second distance sensor 720 may measure a distance between the moving stage unit MSU and the second distance sensor 720 in the x-axis direction X. The controller 900 may receive information about the distances measured by the first and second distance sensors 710 and 720. This will be further discussed in detail below with reference to FIG. 13.

Since the center of gravity of the substrate processing apparatus 10 can be changed due to the moving of the moving stage unit MSU, the balance mass unit 800 can be used to provide the substrate processing apparatus 10 with a stable center of gravity. Accordingly, the balance mass unit 800 may be used to adjust the center of gravity of the substrate processing apparatus 10 due to the movement of the moving stage unit MSU. The balance mass unit 800 may include a first balance mass 801 and a second balance mass 802.

The first and second balance masses 801 and 802 may have a shape extending in the y-axis direction Y. The first and second balance masses 801 and 802 may be spaced apart from each other in the x-axis direction X. The first balance mass 801 may move in the y-axis direction Y along the first guide frame 601. The second balance mass 802 may move in the y-axis direction Y along the second guide frame 602. The first and second balance masses 801 and 802 will be further discussed in detail below with reference to FIGS. 11 and 12.

The controller 900 may be configured to control the balance mass unit 800 and the first, second, and third driving units 450, 500, and 550. The controller 800 may also be configured to control exposure time of light emitted from the exposure light-source unit 250. The controller 900 will be further discussed in detail below.

Figure 5:
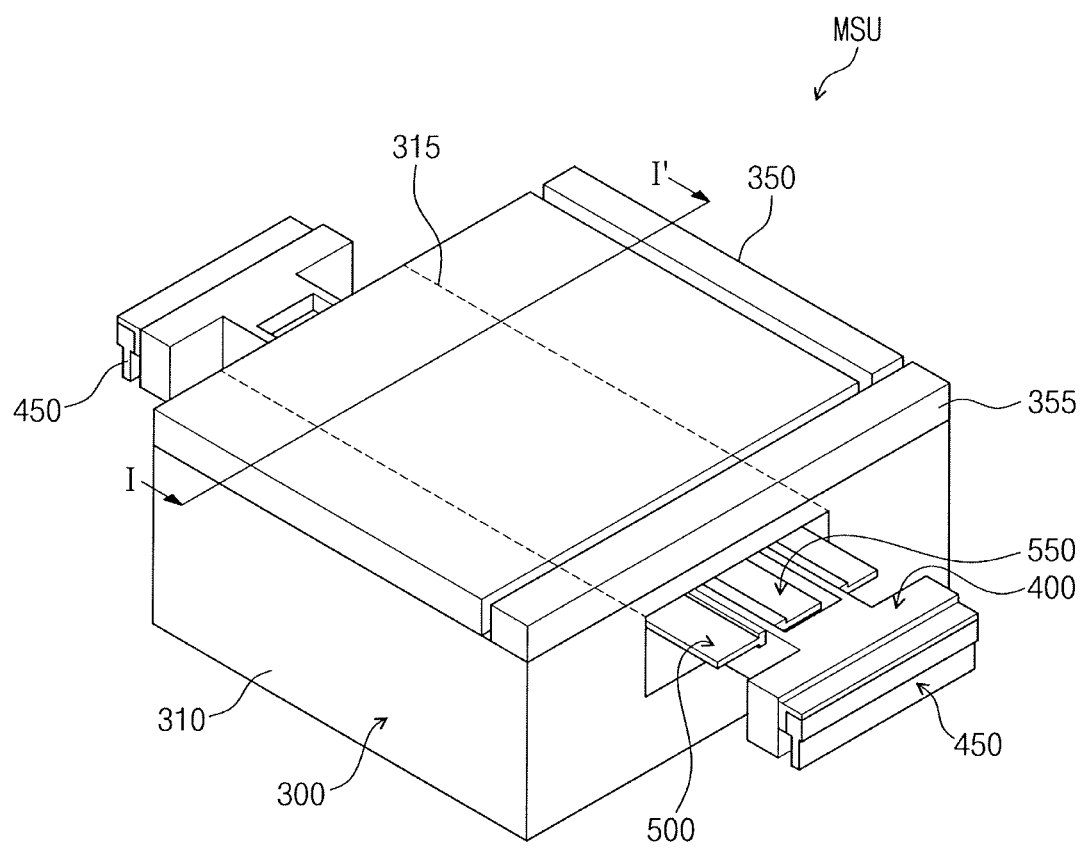
FIG. 5 is a perspective view illustrating a moving stage unit of FIG. 1 according to an exemplary embodiment of the inventive concept.
Figure 6:
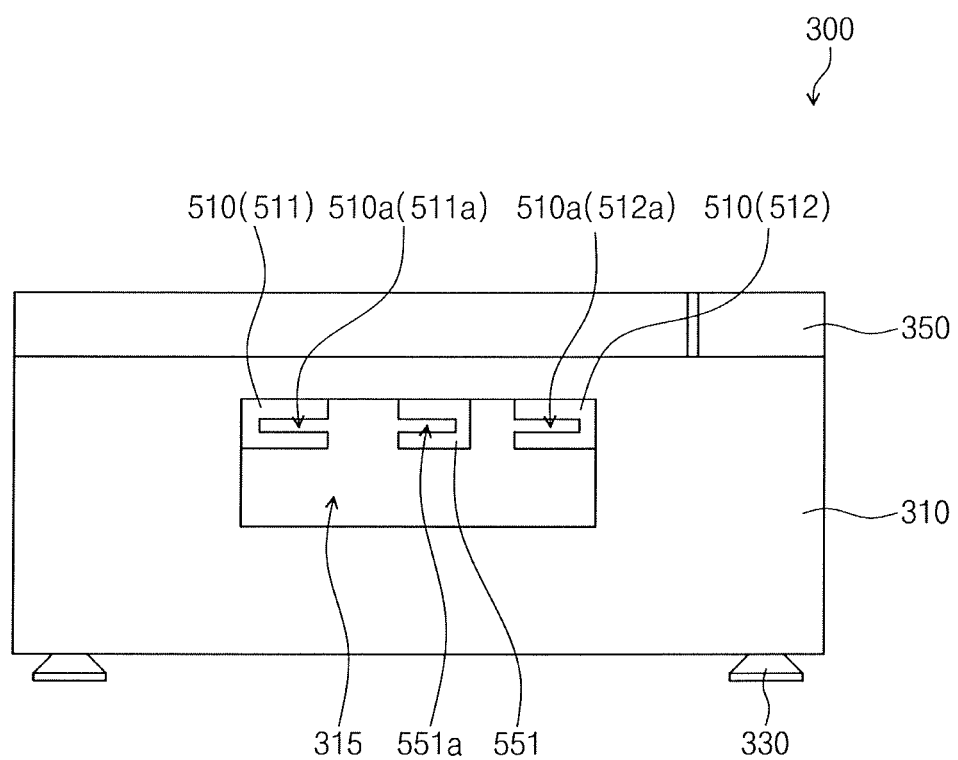
FIG. 6 is a side view illustrating a substrate stage of FIG. 1 according to an exemplary embodiment of the inventive concept.
Figure 7A:
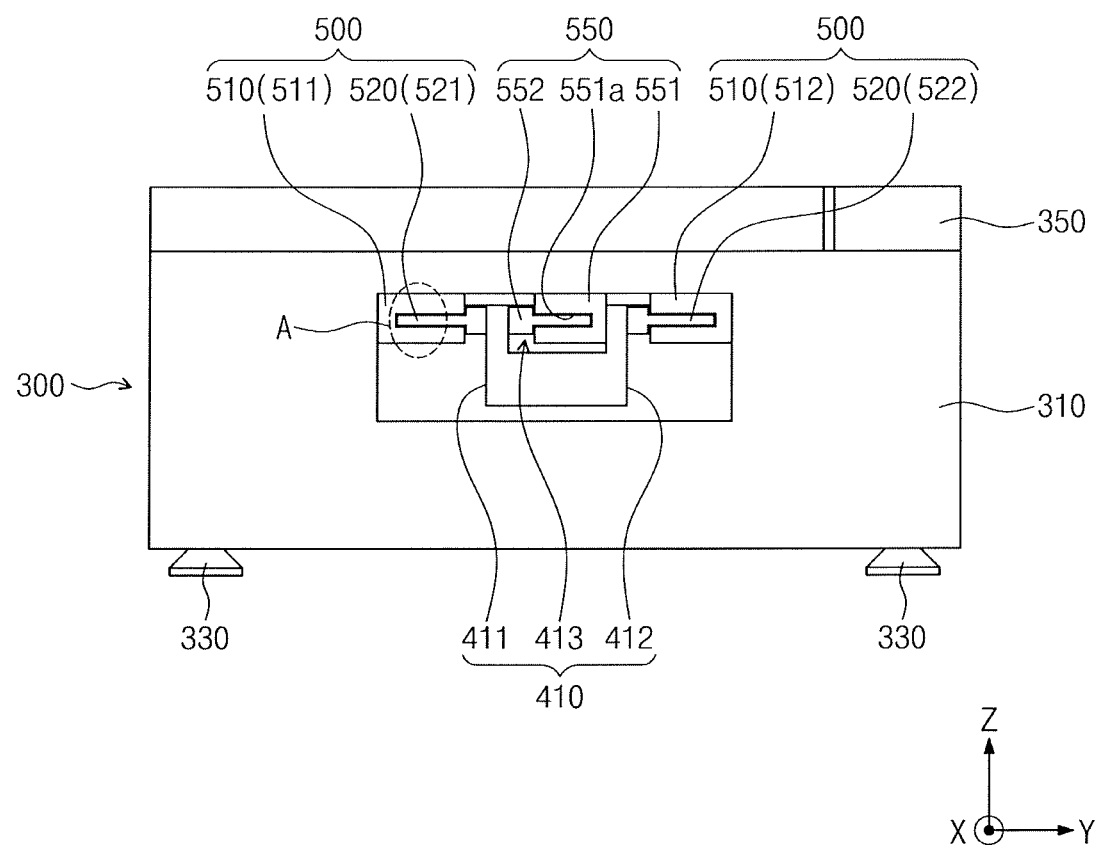
FIG. 7A is a cross-sectional view taken along line I-I' of FIG. 5 according to an exemplary embodiment of the inventive concept.
Figure 8A:
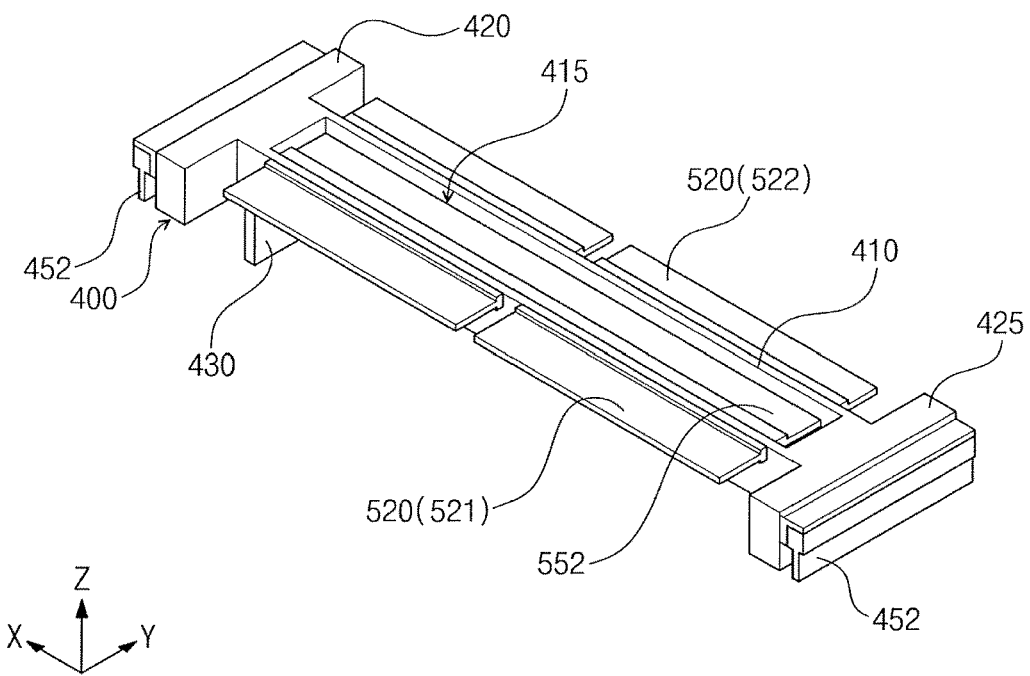
FIGS. 8A and 8B are perspective views illustrating a follower stage and a portion of a first driving unit of FIG. 5 according to an exemplary embodiment of the inventive concept.
Figure 8B:
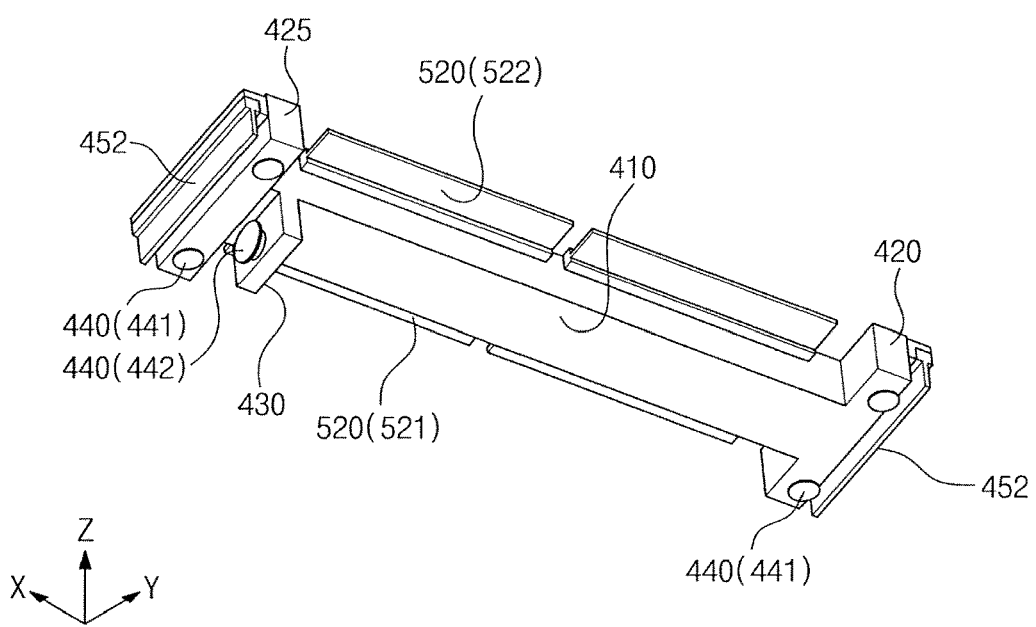

FIG. 5 is a perspective view illustrating a moving stage unit of FIG. 1 according to an exemplary embodiment of the inventive concept. FIG. 6 is a side view illustrating a substrate stage of FIG. 1 according to an exemplary embodiment of the inventive concept. FIG. 7A is a cross-sectional view taken along line I-I' of FIG. 5 according to an exemplary embodiment of the inventive concept. FIG. 7B is an enlarged view of section A of FIG. 7A according to an exemplary embodiment of the inventive concept. FIGS. 8A and 8B are perspective views illustrating a follower stage and a portion of a first driving unit of FIG. 5 according to an exemplary embodiment of the inventive concept.

Referring to FIGS. 5 to 8B, the substrate stage 300 may include a stage body 310, a first reflective segment 350, a second reflective segment 355, and a first air bearing 330.

In an exemplary embodiment of the inventive concept, the stage body 310 may form an external appearance of the substrate stage 300. The stage body 310 may have a roughly rectangular parallelepiped shape. A substrate may be placed on a top surface of the stage body 310. The top surface of the stage body 310 may be a flat surface, but the inventive concept is not limited thereto. The stage body 310 may include a through opening 315 penetrating the stage body 310 in the x-axis direction X. The through opening 315 may have a roughly rectangular section taken on a YZ plane, but the inventive concept is not limited thereto. In an exemplary embodiment of the inventive concept, the through opening 315 may be provided on a central portion of the stage body 310.

The first and second reflective segments 350 and 355 may be provided on the stage body 310. The first reflective segment 350 may reflect a laser beam emitted from the first distance sensor (see 710 of FIG. 4). In an exemplary embodiment of the inventive concept, the first reflective segment 350 may have a reflective surface from which the laser beam is reflected. The reflective surface of the first reflective segment 350 may face the first distance sensor 710.

The second reflective segment 355 may reflect a laser beam emitted from the second distance sensor (see 720 of FIG. 4). In an exemplary embodiment of the inventive concept, the second reflective segment 355 may have a reflective surface from which the laser beam is reflected. The reflective surface of the second reflective segment 355 may face the second distance sensor 720.

The first air bearing 330 may be provided below the stage body 310. The first air bearing 330 may levitate the substrate stage 300 from the base frame 100. For example, the first air bearing may thrust, eject or move gas particles to support the weight of the stage body 310. The substrate stage 300 may then be spaced apart from, and disposed above the first and second upper bases 120 and 130. When the substrate stage 300 moves in the x-axis direction X or in the y-axis direction Y, the base frame 100 may not receive a reaction in the x-axis direction X or in the y-axis direction Y from the substrate stage 300 but only receive force in the z-axis direction Z. The follower stage 400 may be disposed on the same plane as the substrate stage 300. In this configuration, when the substrate stage 300 moves in the x-axis direction X and/or in the y-axis direction Y, the follower stage 400 may receive a reaction in the x-axis direction and/or in the y-axis direction Y.

As shown in FIGS. 8A and 8B, the follower stage 400 may include a through member 410 passing through the through opening 315. The follower stage 400 may include first and second interconnect members 420 and 425 connected to opposite distal ends of the through member 410 and a protruding member 430 provided below the through member 410. In an exemplary embodiment of the inventive concept, the follower stage 400 may have roughly an I-letter shape, but the inventive concept is not limited thereto.

The through member 410 may be provided in a bar shape extending in the x-axis direction X. The through member 410 may include a first surface 411 and a second surface 412 facing each other in the y-axis direction Y. The first and second surfaces 411 and 412 may be flat surfaces. One or more components of the second driving unit 500 may be engaged with each of the first and second surfaces 411 and 412.

The through member 410 may include an intermediate opening 413 provided between the first and second surfaces 411 and 412. The intermediate opening 413 may be provided along the x-axis direction X. The intermediate opening 413 may be shaped like a groove or hole. The intermediate opening 413 may include one or more components of the third driving unit 550.

The first and second interconnect members 420 and 425 may have a bar shape extending in the y-axis direction Y.

One or more components of the first driving unit 450 may be engaged with the first and second interconnect members 420 and 425. At least one of the first and second interconnect members 420 and 425 may be detachably engaged with the through member 410. The protruding member 430 may be disposed adjacent to one of the first and second interconnect members 420 and 425.

The follower stage 400 may include second air bearings 440 (441 and 442). In an exemplary embodiment of the inventive concept, the second air bearings 441 may be provided on lower portions of the first and second interconnect members 420 and 425, and the second air bearing 442 may be provided on a side surface of the protruding member 430. The second air bearings 441 may levitate the follower stage 400 from the guide frame unit 600. When the follower stage 400 moves in the y-axis direction Y, the base frame 100 may not receive a force in the x-axis direction, the y-axis direction Y, or the z-axis direction Z.

The first driving unit 450 may include a first motor coil member 452 engaged with each of the first and second interconnect members 420 and 425, and a first motor magnet member (see 451 of FIG. 9) engaged with each of the first and second guide frames (see 601 and 602 of FIG. 1). When the first motor coil member 451 is applied with current, the first motor coil member 451 may experience thrust in the y-axis direction Y. The follower stage 400 may therefore move in the y-axis direction Y. The thrust may have magnitude in proportion to a value obtained by multiplying a magnitude of the current applied to the first motor coil member 452 and the magnetic flux of the first motor magnet member 451. In an exemplary embodiment of the inventive concept, the first driving unit 450 may be, but is not limited to, a linear motor.

The second driving unit 500 may include a voice magnet member 510 provided on the substrate stage 300 and a voice coil member 520 provided on the follower stage 400. In an exemplary embodiment of the inventive concept, the second driving unit 500 may be, but is not limited to, a voice coil motor.

The voice magnet member 510 may be disposed in the through opening 315 of the stage body 310. For example, the voice magnet member 510 may be fixedly engaged with an inner wall of the through opening 315. The voice magnet member 510 may include a permanent magnet extending in the x-axis direction X. However, it is understood that the voice magnet member 510 may also include an electromagnet. The voice magnet member 510 may include insert openings 511a and 512a into which the voice coil member 520 is respectively inserted. In an exemplary embodiment of the inventive concept, the insert openings 511a and 512a may be shaped like a groove, or alternatively, like a hole. In an exemplary embodiment of the inventive concept, as shown in FIG. 7A, a depth of the opening 511a in the y-axis direction Y is smaller than a length of the first voice magnet 511 in the x-axis direction. The voice magnet member 510 may include first and second voice magnets 511 and 512 spaced apart from each other in the y-axis direction Y. In an exemplary embodiment of the inventive concept, the first voice magnet 511 may include the insert opening 511a, and the second voice magnet 512 may include the insert opening 512a. The first and second voice magnets 511 and 512 may be provided to have a bracket (or an open square) sectional shape taken on the ZY plane.

The voice coil member 520 may be provided on the through member 410 of the follower stage 400. The voice coil member 520 may include a first coil plate 521 that is inserted into the first insert opening 511a of the first voice magnet 511 and a second coil plate 522 that is inserted into the second insert opening 512a of the second voice magnet 512. The first and second coil plates 521 may include an electromagnetic coil. The voice coil member 520 may be positioned in a magnetic field generated by the voice magnet member 510 such that the voice magnet member 510 may experience a Lorentz force in the y-axis direction Y. In this configuration, when the voice coil member 520 is applied with current, the substrate stage 300 may move in the y-axis direction Y.

The first coil plate 521 may be provided on the first surface 411 of the through member 410. The second coil plate 522 may be provided on the second surface 412 of the through member 410. In an exemplary embodiment of the inventive concept, each of the first and second coil plates 521 and 522 may include two sub plates spaced apart from each other in the x-axis direction X.

As shown in FIG. 7B, the voice coil member 520 may be spaced apart from the voice magnet member 510. In an exemplary embodiment of the inventive concept, the first voice magnet 511 may be spaced apart from the first coil plate 521, inserted into the first insert opening 511a of the first voice magnet 511. The second voice magnet 512 may be spaced apart from the second coil plate 522, inserted into the second insert opening 512a of the second voice magnet 512. For example, a gap G1 of about 2 mm to about 6 mm may be formed between a top surface of the first coil plate 521 and an inner surface of the first voice magnet 511 that faces the top surface of the first coil plate 521. A gap G2 of about 2 mm to about 6 mm may be formed between a bottom surface of the first coil plate 521 and an inner surface of the first voice magnet 511 that faces the bottom surface of the first coil plate 521. However, the inventive concept is not limited thereto.

The third driving unit 550 may drive the substrate stage 300 to move the substrate stage 300 in the x-axis direction X. In an exemplary embodiment of the inventive concept, the third driving unit 550 may be, but is not limited to, a linear motor. The third driving unit 550 may include a second motor magnet member 551 provided on the substrate stage 300 and a second motor coil member 552 provided on the follower stage 400. Alternatively, in an exemplary embodiment of the inventive concept, the second motor magnet member 551 may be provided on the follower stage 400, and the second motor coil member 552 may be provided on the substrate stage 300.

The second motor magnet member 551 may be provided in the through opening 315. The second motor magnet member 551 may be spaced apart from the voice magnet member 510 of the second driving unit 500. In an exemplary embodiment of the inventive concept, the second motor magnet member 551 may be provided between the first and second voice magnets 511 and 512. In addition, a portion of the second motor magnet member 551 may be disposed in the intermediate opening 413 of the through member 410.

The second coil member 552 may be provided on the through member 410 of the follower stage 400. In an exemplary embodiment of the inventive concept, the second motor magnet member 552 may be disposed in the intermediate opening 413 of the through member 410. The second motor coil member 552 may be disposed between the first and second coil plates 521 and 522. The second motor coil member 552 may have a plate shape extending in the x-axis direction X. The second motor coil member 552 may be inserted into a groove 551a formed on the second motor magnet member 551. When the second motor coil member 552 is applied with current, the second motor magnet member 551 may experience thrust in the x-axis direction X. The substrate stage 300 may therefore move the x-axis direction X.

Figure 9:
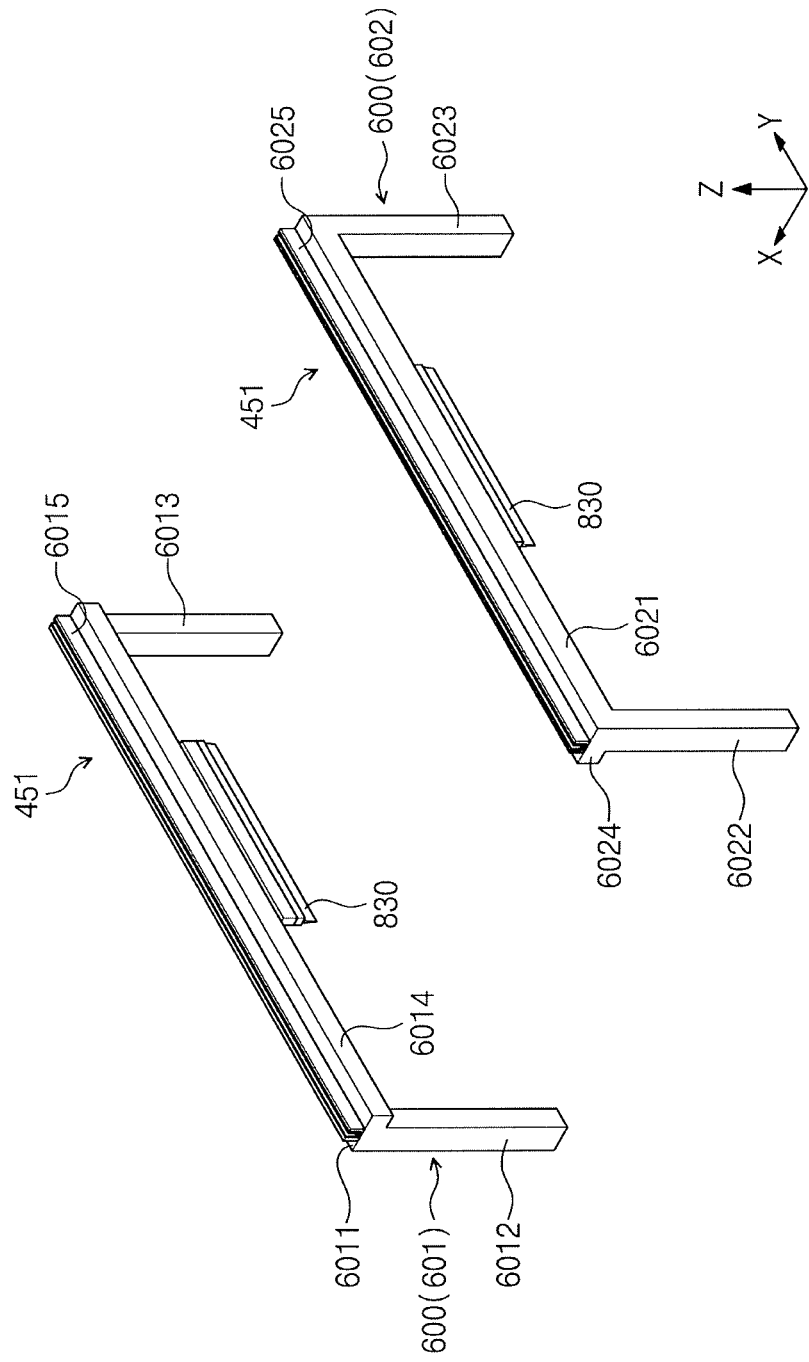
FIG. 9 is a perspective view illustrating a guide frame unit, a portion of a first driving unit, and a portion of a balance mass unit of FIG. 1, according to an exemplary embodiment of the inventive concept.
Figure 10:
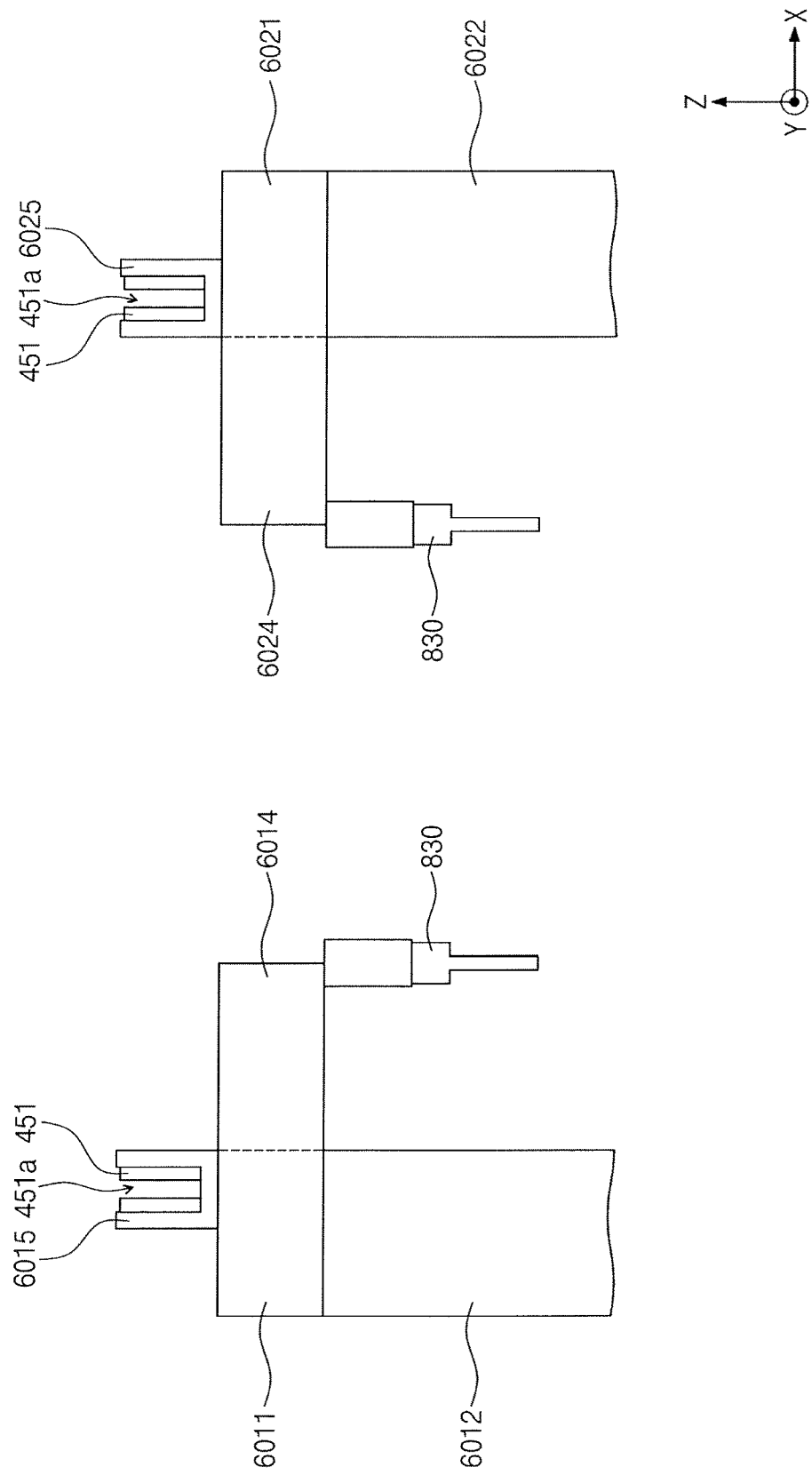
FIG. 10 is a front view illustrating a guide frame unit, a portion of a first driving unit, and a portion of a balance mass unit of FIG. 1, according to an exemplary embodiment of the inventive concept.

FIG. 9 is a perspective view illustrating a guide frame unit, a portion of a first driving unit, and a portion of a balance mass unit of FIG. 1, according to an exemplary embodiment of the inventive concept. FIG. 10 is a front view illustrating a guide frame unit, a portion of a first driving unit, and a portion of a balance mass unit of FIG. 1, according to an exemplary embodiment of the inventive concept.

Referring to FIGS. 9 and 10, the guide frame unit 600 may include the first and second guide frames 601 and 602 spaced apart from each other in the x-axis direction X. The first and second guide frames 601 and 602 may respectively include guide portions 6011 and 6021, first support portions 6012 and 6022 that support first sides of the guide portions 6011 and 6021, and second support portions 6013 and 6023 that support second sides of the guide portions 6011 and 6021. The first and second guide frames 601 and 602 may further include corresponding extension portions 6014 and 6024 that extend toward the substrate stage (see 300 of FIG. 3) from the guide portions 6011 and 6021, and motor magnet accommodating portions 6015 and 6025 that are provided on respective top surfaces of the guide portions 6011 and 6021. The motor magnet accommodating portions 6015 and 6025 may extend in the y-axis direction Y on the guide portions 6011 and 6021. The motor magnet accommodating portions 6015 and 6025 may include accommodating grooves 451a extending in the y-axis direction Y.

In an exemplary embodiment of the inventive concept, the first support portions 6012 and 6022 may be connected to corresponding distal ends of the guide portions 6011 and 6021, and the second support portions 6013 and 6023 may be connected to corresponding opposite distal ends of the guide portions 6011 and 6021. Each of the first and second support portions 6012, 6013, 6022, and 6023 may be parallel to the z-axis direction Z, and the guide portions 6011 and 6021 and the extension portions 6014 and 6024 may be parallel to the y-axis direction Y.

Each of the first and second support portions 6012, 6013, 6022, and 6023 may be connected to the ground. The guide frame unit 600 may absorb a reaction produced when the follower stage (see 400 of FIG. 3) is moving, and the reaction may be transferred to the ground. For example, the guide frame unit 600 may force the ground to take the reaction in the y-axis direction Y caused by the movement of the follower stage 400 and the reaction in the z-axis direction Z caused by the movement of the follower stage 400. In other words, the guide frame unit 600 may absorb the reaction generated when the follower stage 400 is moving. The reaction may also be absorbed or reduced through the control of the balance mass unit 800, engaged with the guide frame unit 600.

The first driving unit 450 may be partly accommodated in the motor magnet accommodating portions 6015 and 6025 of the guide frame unit 600. In an exemplary embodiment of the inventive concept, the first motor magnet member 451 may be inserted into the accommodating grooves 451a of each of the motor magnet accommodating portions 6015 and 6025. Therefore, the first motor magnet member 451 may be fixedly engaged with the guide frame unit 600.

In an exemplary embodiment of the inventive concept, the first motor magnet member 451 may include a groove 451a into which the first motor coil member 451 is inserted. The first motor coil member 451 may then be positioned in a magnetic field produced by the first motor magnet member 451. The first motor magnet member 451 may have a roughly bracket (e.g., an open square) sectional shape, but the inventive concept is not limited thereto.

A first linear scale may be provided on a top surface of each of the guide portions 6011 and 6021. The first linear scale may be provided along the y-axis direction Y. The first linear scale may include information about a y-axis position along the y-axis direction Y. As the first encoder head (see 470 of FIG. 4) moves in the y-axis direction Y together with the follower stage 400, the information about the y-axis position of the first encoder head (see 470 of FIG. 4) and/or the follower stage 400 may be obtained from the first linear scale. Accordingly, the location of the follower stage 400 may be determined along the y-axis direction Y.

One or more components of the balance mass unit 800 may be engaged with the extension portions 6014 and 6024, as described below with reference to FIGS. 11 and 12.

Figure 11:
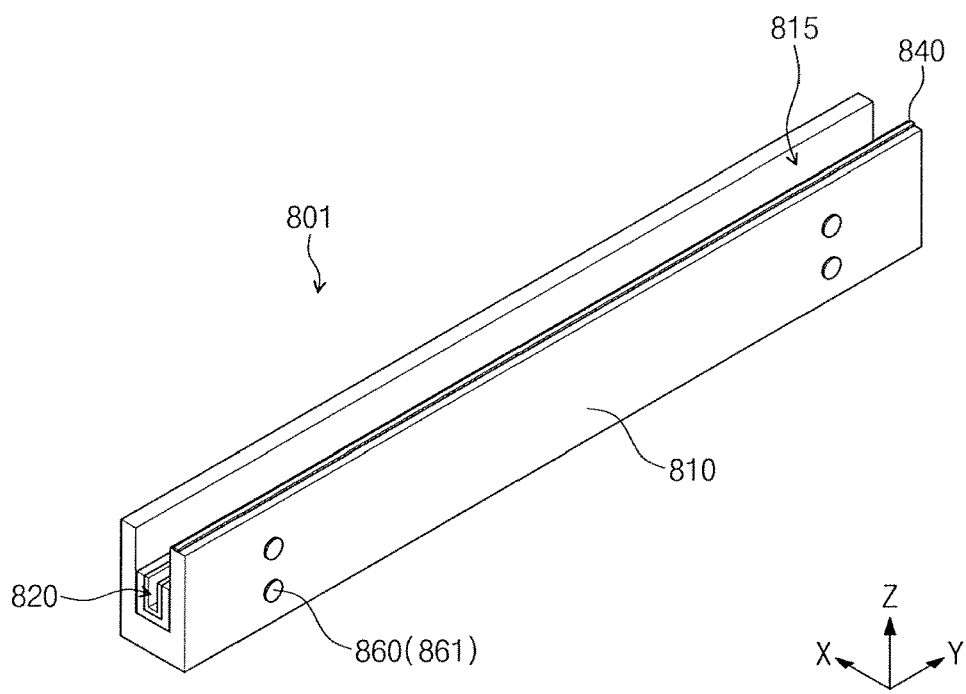
FIG. 11 is a perspective view illustrating a balance mass unit of FIG. 1 according to an exemplary embodiment of the inventive concept.
Figure 12:
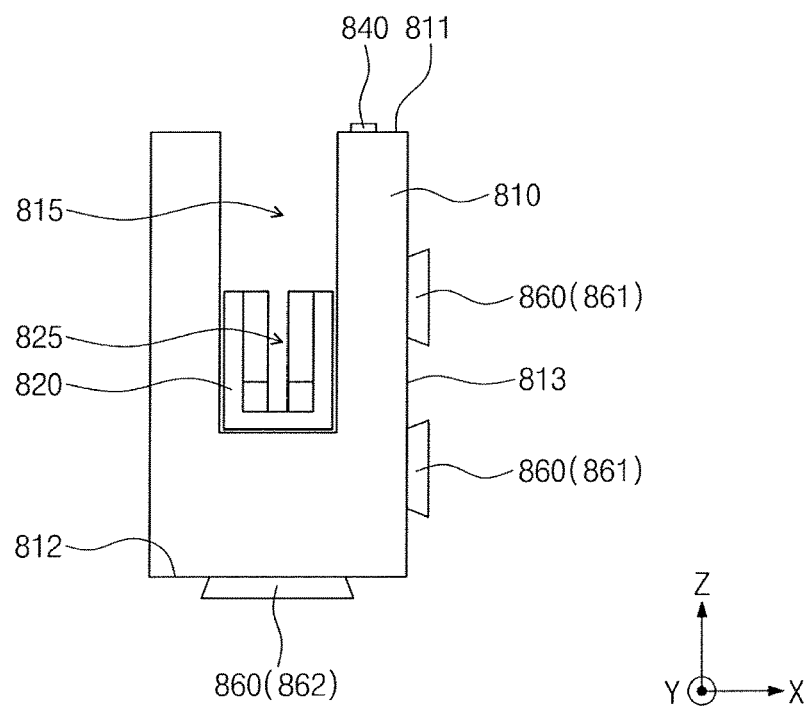
FIG. 12 is a front view illustrating a balance mass unit of FIG. 1 according to an exemplary embodiment of the inventive concept.

FIG. 11 is a perspective view illustrating a balance mass unit of FIG. 1 according to an exemplary embodiment of the inventive concept. FIG. 12 is a front view illustrating a balance mass unit of FIG. 1 according to an exemplary embodiment of the inventive concept. As discussed above, the balance mass unit 800 may include the first balance mass 801 and the second balance mass 802. Since the first and second balance masses 801 and 802 may have the same configuration, only the first balance mass 801 will be described in detail below for brevity.

Referring to FIGS. 8A to 12, the first balance mass 801 may include a balance body 810, a third motor magnet member 820, and a third motor coil member 830 (See FIG. 10). The first balance mass 801 may further include a second linear scale 840, a second encoder head (see 850 of FIG. 4), and a third air bearing 860.

The balance body 810 may be provided in a bar shape extending in the y-axis direction Y. The balance body 810 may include a first balance groove 815 into which the third motor magnet member 820 or the third motor coil member 830 is inserted. The first balance groove 815 may extend along the y-axis direction Y. In an exemplary embodiment of the inventive concept, the balance body 810 may be provided to have a roughly bracket (or an open square) or U-letter sectional shape taken on the ZX plane, but the inventive concept is not limited thereto. The balance body 810 may have a mass used in balancing the center of gravity of the structure including at least the guide frame unit 600 and the moving stage unit MSU. The center of gravity of the structure including at least the guide frame unit 600 and the moving stage unit MSU may need to be balanced due to the movement of the moving stage unit MSU.

The third motor magnet member 820 may be inserted into the first balance groove 815. In an exemplary embodiment of the inventive concept, the third motor magnet member 820 may be fixed in the first balance groove 815. The third motor magnet member 820 may be provided in a bar shape extending in the y-axis direction Y. The third motor magnet member 820 may include a second balance groove 825 provided along the y-axis direction Y. In an exemplary embodiment of the inventive concept, the third motor magnet member 820 may be provided to have a roughly bracket (or an open square) sectional shape taken on the ZX plane. Alternatively, in an exemplary embodiment of the inventive concept, the third motor magnet member 820 may be provided as a pair of permanent magnets or electromagnets shaped like plates and spaced apart from each other in the x-axis direction X and elongated in the y-axis direction Y.

As shown in FIGS. 9 and 10, the third motor coil member 830 may be provided on the guide frame unit 600. In an exemplary embodiment of the inventive concept, the third motor coil member 830 of the first balance mass 801 may be fixed on the extension portion 6014 of the first guide frame 601. The third motor coil member 830 may be positioned below the extension portion 6014.

The third motor magnet member 830 may be inserted into the second balance groove 825. The third motor coil member 830 may then be positioned in magnetic field produced by the third motor magnet member 820. When the third motor coil member 830 is applied with current, the third motor coil member 820 may experience thrust in the y-axis direction Y. Hence, the balance body 810 may move in the y-axis direction Y together with the third motor magnet member 820.

The second linear scale 840 may be provided on a top surface 811 of the balance body 810. For example, the second linear scale 840 may be provided along the y-axis direction Y on the top surface 811 of the balance body 810. The second linear scale 840 may be used to determine a position of the balance body 810 along the y-axis direction Y.

The second encoder head 850 may be provided on the guide frame unit 600. In an exemplary embodiment of the inventive concept, the second encoder head 850 may be fixed on the extension portion 6014. The second encoder head 850 may obtain the information about the position of the balance body 810, on the second linear scale 840, along the y-axis direction Y using the second linear scale 840. The obtained information may be delivered to the controller (see 900 of FIG. 4) from the second encoder head 850. The controller 900 may control a position of the balance body 810 in the y-axis direction Y by using the information indicating the position of the balance body 810. For example, the controller 900 may adjust current applied to the third motor coil member 830 to control the position of the balance body 810 in the y-axis direction Y.

The third air bearings 860 (861 and 862) may be provided on the balance body 810. In an exemplary embodiment of the inventive concept, the balance body 810 may have a side surface 813 which faces a side surface of the first upper frame (see 120 of FIG. 3), and on which the third air bearing 861 is provided. The third air bearing 861 may create a preload. The balance body 810 may also have a bottom surface 812 which faces a top surface of the lower base (see 110 of FIG. 3), and on which the third air bearing 862 is provided. The third air bearing 862 may levitate the balance body 810 from a top surface of the base frame (see 100 of FIG. 3). Therefore, the balance body 810 may move in the y-axis direction Y while reducing or minimizing a horizontal error caused by variation in center of gravity of the balance frame 100.

Figure 13:
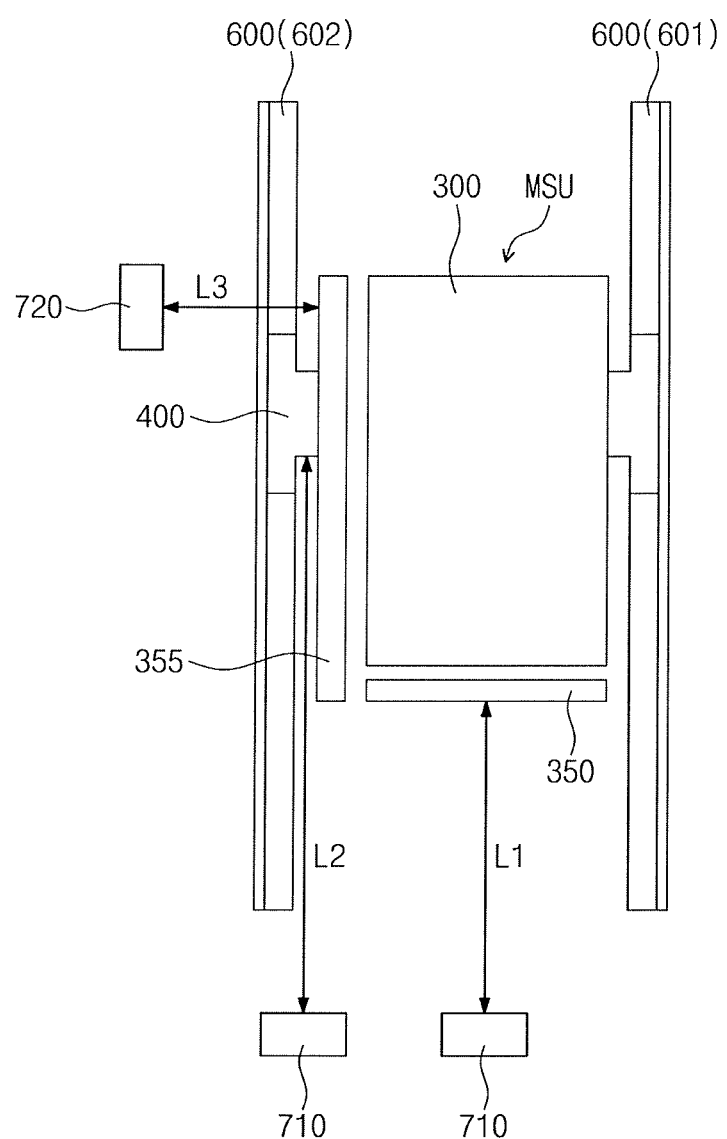
FIG. 13 is a diagram illustrating movement of a moving stage unit of FIG. 1 according to an exemplary embodiment of the inventive concept.

FIG. 13 is a diagram illustrating movement of a moving stage unit of FIG. 1 according to an exemplary embodiment of the inventive concept.

Referring to FIGS. 4 and 13, the first distance sensor 710 may be spaced apart from the moving stage unit MSU in the y-axis direction Y. The first distance sensor 710 may measure a position of the substrate stage 300 in the y-axis direction Y.

For example, the first distance sensor 710 may direct a laser beam toward the substrate stage 300. The laser beam may be reflected from the first reflective segment 350 of the substrate stage 300. The first distance sensor 710 may receive the reflected laser beam to measure a first distance L1 in the y-axis direction Y between the first distance sensor 710 and the substrate stage 300. The first distance sensor 710 may also measure a second distance L2 in the y-axis direction Y between the first distance sensor 710 and the follower stage 400. The second distance sensor 720 may be spaced apart from the moving stage unit MSU in the x-axis direction X. The second distance sensor 720 may measure a third distance L3 in the x-axis direction X between the second distance sensor 720 and the substrate stage 300. The controller 900 may receive information about the first, second, and third distances L1, L2, and L3 measured by the first and second distance sensors 710 and 720. The controller 900 may use the received information about the first to third distances L1 to L3 to calculate at least one of the x- and y-axis positions of the substrate stage 300 and the y-axis position of the follower stage 400. Alternatively, in an exemplary embodiment of the inventive concept, the first encoder head 470 may move in the y-axis direction Y together with the follower stage 400, on which the first encoder head 470 is provided. The first encoder head 470 moving in the y-axis direction Y may acquire information about the y-axis position of the follower stage 400 from the first linear scale, which may be provided on the guide frame unit 600. The controller 900 may receive from the first encoder head 470 the acquired information about the y-axis position of the follower stage 400.

Figure 14:
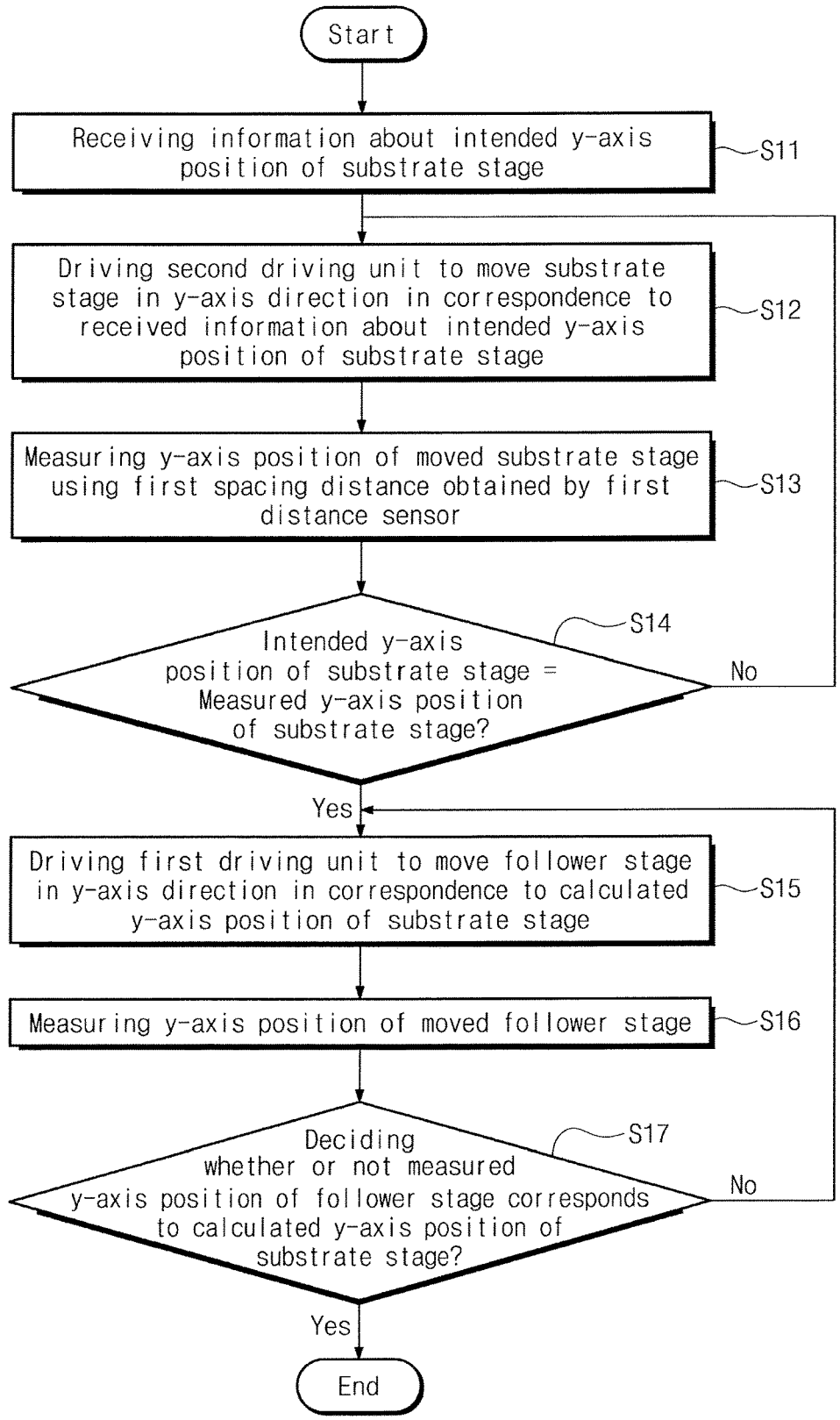
FIG. 14 is a flow chart illustrating a driving operation of a moving stage unit of FIG. 1, according to an exemplary embodiment of the inventive concept.

FIG. 14 is a flow chart illustrating a driving operation of a moving stage unit of FIG. 1, according to an exemplary embodiment of the inventive concept.

Referring to FIGS. 4, 13 and 14, the controller 900 may receive information about an intended y-axis position of the substrate stage 300 (S11) through an external input section. The controller 900 may control the second driving unit 500 based on the received information about the intended y-axis position of the substrate stage 300. The second driving unit 500 may drive the substrate stage 300 in the y-axis direction Y to place the substrate stage 300 in the intended y-axis position (S12).

The first distance sensor 710 may measure a first distance L1 between the first distance sensor 710 and the substrate stage 300 that has moved, and the measured first distance L1 may be transferred from the first distance sensor 710 to the controller 900. The controller 900 may use the first distance L1 to measure the y-axis position of the substrate stage 300 that has moved (S13).

The controller 900 may decide whether or not the measured y-axis position of the moved substrate stage 300 corresponds to the intended y-axis position of the substrate stage 300 (S14). When the measured y-axis position of the moved substrate stage 300 does not correspond to the intended y-axis position of the substrate stage 300, the controller 900 may control the second driving unit 500 such that the substrate stage 300 may be moved again in the y-axis direction Y. When the measured y-axis position of the moved substrate stage 300 corresponds to the intended y-axis position of the substrate stage 300, the controller 900 may control the first driving unit 450 based on the calculated (or the intended) y-axis position of the substrate stage 300. The first driving unit 450 may then drive the follower stage 400 to place the follower stage 400 in the position corresponding to the calculated y-axis position of the substrate stage 300 (S15). For example, in an exemplary embodiment of the inventive concept, when the substrate stage 300 moves to a first location in the y-axis direction Y, the first driving unit 450 moves the follower stage 400 in the y-axis direction Y is placed in location corresponding to the first location.

In an exemplary embodiment of the inventive concept, the first distance sensor 710 may measure a second distance L2 between the first distance sensor 710 and the follower stage 400 that has moved, and the measured second distance L2 may be transferred to the controller 900 from the first distance sensor 710. The controller 900 may use the second distance L2 to measure the y-axis position of the follower stage 400 that has moved (S16).

The controller 900 may decide whether or not the measured y-axis position of the moved substrate stage 300 corresponds to the calculated y-axis position of the substrate stage 300 (S17). When the measured y-axis position of the follower stage 400 does not correspond to the calculated y-axis position of the substrate stage 300, the controller 900 may control the first driving unit 450 such that the follower stage 400 may be moved again in the y-axis direction Y. The follower stage 400 may follow the substrate stage 300.

Figure 15:
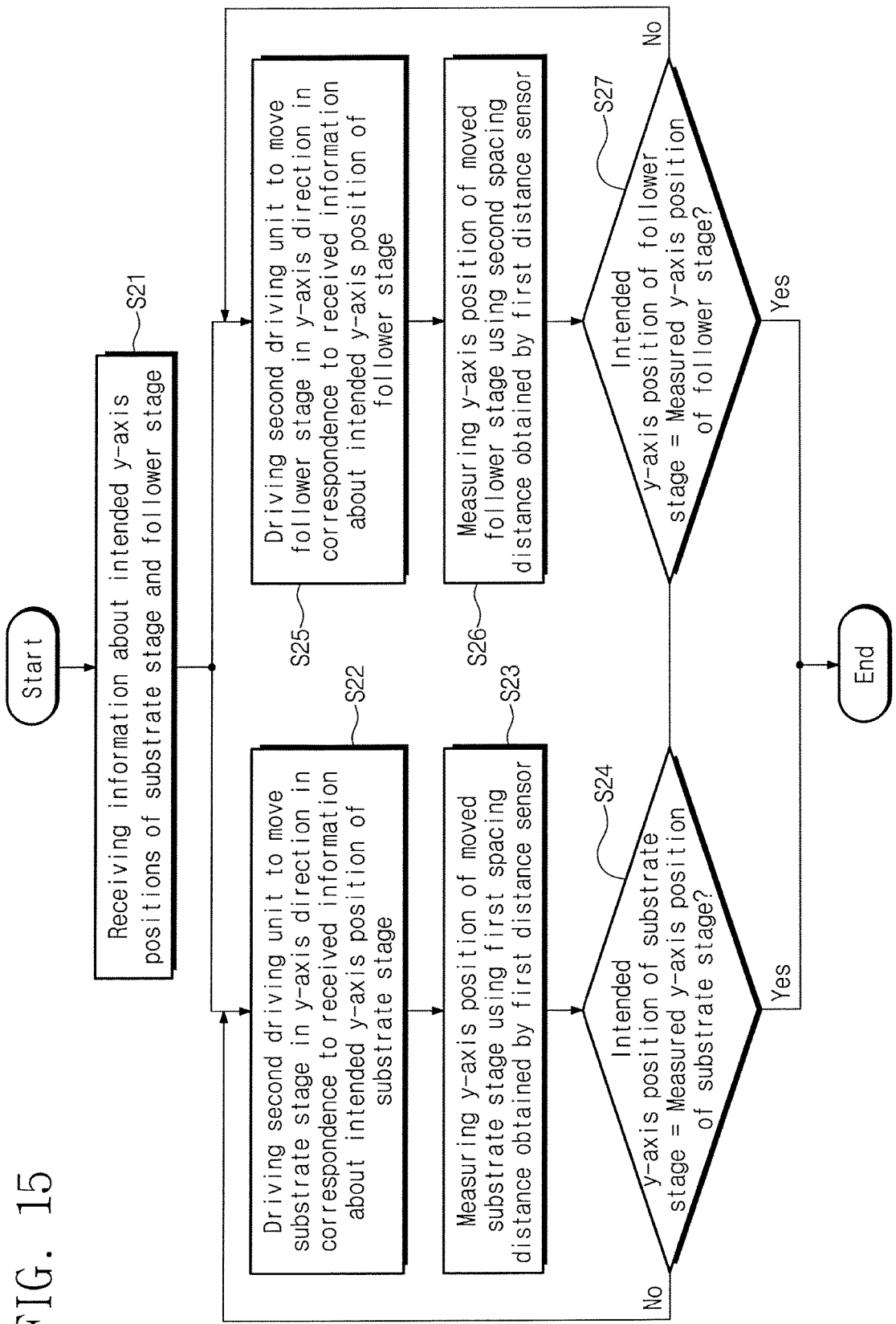
FIG. 15 is a flow chart illustrating a driving operation of a moving stage unit of FIG. 1, according to an exemplary embodiment of the inventive concept.

FIG. 15 is a flow chart illustrating a driving operation of a moving stage unit of FIG. 1, according to an exemplary embodiment of the inventive concept.

Referring to FIGS. 4, 13 and 15, the controller 900 may simultaneously receive information about intended y-axis positions of the substrate stage 300 and the follower stage 400 through an external input (S21). The controller 900 may control the second driving unit 500 based on the received information about the intended y-axis position of the substrate stage 300. The second driving unit 500 may drive the substrate stage 300 in the y-axis direction Y to place the substrate stage 300 in the position corresponding to the intended y-axis position (S22).

The first distance sensor 710 may measure a first distance L1 between the first distance sensor 710 and the substrate stage 300 that has moved, and the measured first distance L1 may be transferred to the controller 900 from the first distance sensor 710. The controller 900 may use the first distance L1 to measure a y-axis position of the substrate stage 300 that has moved (S23).

The controller 900 may decide whether or not the measured y-axis position of the moved substrate stage 300 corresponds to the intended y-axis position of the substrate stage 300 (S24). When the measured y-axis position of the moved substrate stage 300 does not correspond to the intended y-axis position of the substrate stage 300, the controller 900 may control the second driving unit 500 such that the substrate stage 300 may be moved again in the y-axis direction Y.

The controller 900 may control the first driving unit 450 based on the received information about the intended y-axis position of the follower stage 400. The first driving unit 450 may drive the follower stage 400 in the y-axis direction Y to place the follower stage 400 in the intended y-axis position (S25).

The first distance sensor 710 may measure a second distance L2 between the first distance sensor 710 and the follower stage 400 that has moved, and the measured second distance L2 may be delivered to the controller 900 from the first distance sensor 710. The controller 900 may use the second distance L2 to measure a y-axis position of the follower stage 400 that has moved (S26).

The controller 900 may decide whether or not the measured y-axis position of the moved follower stage 400 corresponds to the intended y-axis position of the follower stage 400 (S27). When the measured y-axis position of the moved follower stage 400 does not correspond to the intended y-axis position of the follower stage 400, the controller 900 may control the first driving unit 450 to move the follower stage 400 in the y-axis direction Y to the intended y-axis position.

Figure 16:
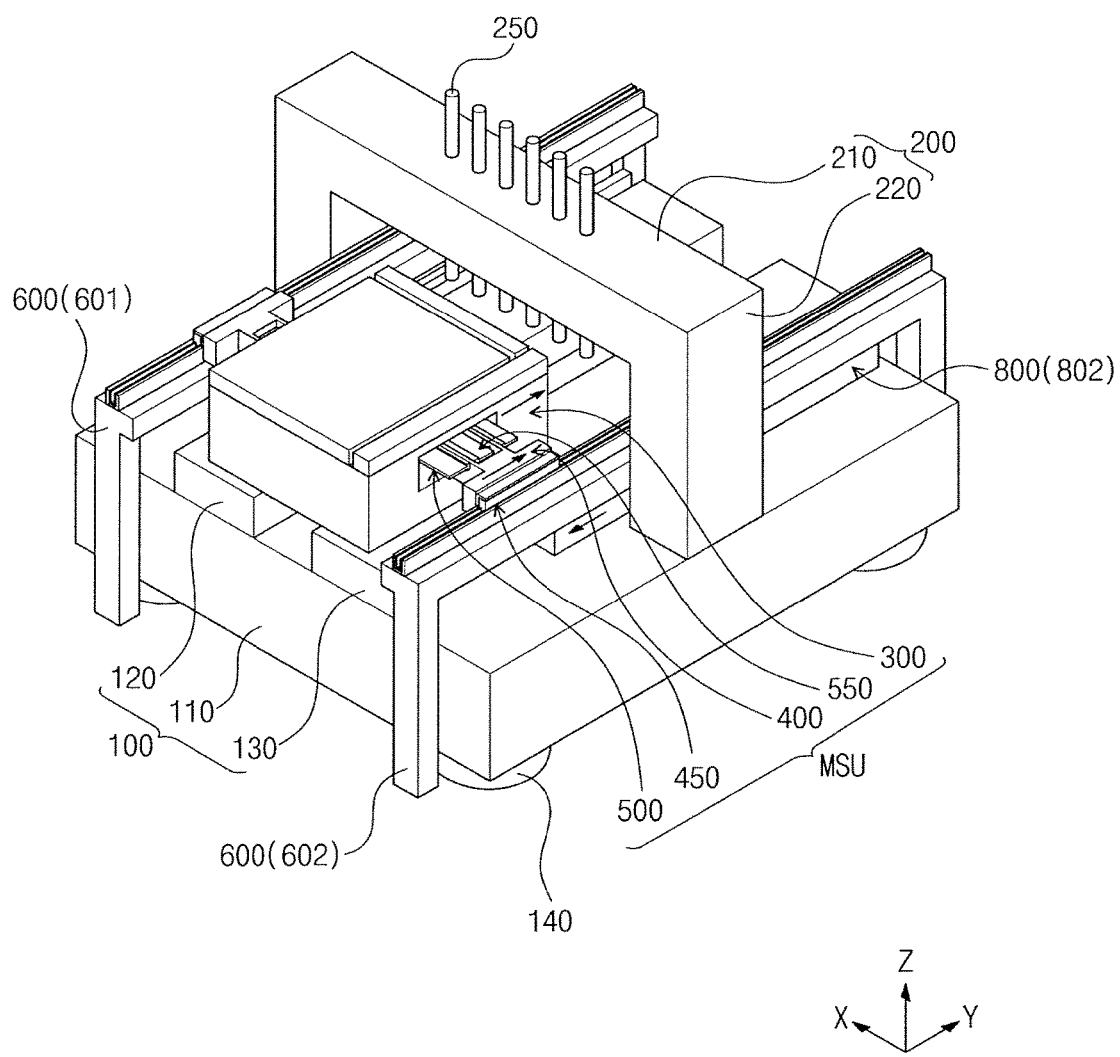
FIG. 16 is a perspective view illustrating a movement relationship between a moving stage unit and a balance mass unit of FIG. 1 according to an exemplary embodiment of the inventive concept.

FIG. 16 is a perspective view illustrating a movement relationship between a moving stage unit and a balance mass unit of FIG. 1 according to an exemplary embodiment of the inventive concept.

Referring to FIG. 16, the moving stage unit MSU may move along the y-axis direction Y, and at the same time, the first and second balance masses 801 and 802 may move in an opposite direction to that of the moving stage unit MSU. For example, the first and second balance masses 801 and 802 may move in an opposite direction to that of the follower stage 400 and/or the substrate stage 300. Accordingly, the substrate processing apparatus 10 may be prevented from changing its center of gravity due to the movement of the moving stage unit MSU. The movement of the balance mass unit 800 may counterbalance a reaction transferred to the guide frame unit 600 when the follower stage 400 is moving.

According to the inventive concept, as the substrate stage 300 moves without being in contact with the follower stage 400, external disturbance acting on the substrate stage 300 from the follower stage 400 may be blocked. A reaction caused by the movement of the follower stage 400 may be compensated by the balance mass unit 800 or may be delivered to the ground through the guide frame unit 600. Therefore, the reaction caused by the movement of the follower stage 400 may not be delivered to the substrate stage 300.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A substrate processing apparatus, comprising:
a substrate stage that supports a substrate;
a follower stage disposed on a same plane as the substrate stage;
a first driving unit that moves the follower stage in parallel with a first direction; and
a second driving unit that moves the substrate stage in parallel with the first direction,
wherein the second driving unit comprises:
a voice magnet member disposed on the substrate stage; and
a voice coil member disposed on the follower stage and spaced apart from the voice magnet member,
wherein the substrate stage comprises a through opening penetrating the substrate stage in a second direction crossing the first direction,
wherein the follower stage comprises a through member that passes through the through opening,
wherein the voice coil member is disposed on the through member, and
wherein the voice magnet member is disposed in the through opening,
wherein the voice coil member comprises:
a first coil plate disposed on a first surface of the through member; and
a second coil plate disposed on a second surface of the through member, the second surface being spaced apart from the first surface in the first direction,
wherein the voice magnet member comprises:
a first voice magnet including a first opening into which the first coil plate is inserted; and
a second voice magnet including a second opening into which the second coil plate is inserted, the second voice magnet being spaced apart from the first voice magnet in the first direction.

2. The substrate processing apparatus of claim 1, wherein the voice magnet member comprises an opening into which the voice coil member is inserted.

3. The substrate processing apparatus of claim 1, further comprising a third driving unit that moves the substrate stage in parallel with the second direction,
  wherein the third driving unit comprises:
    a motor coil member disposed on the through member; and
    a motor magnet member disposed in the through opening.

4. The substrate processing apparatus of claim 3, wherein the through member comprises an intermediate opening between a first surface and a second surface of the through member, wherein the first and second surfaces of the through member are spaced apart from each other in the first direction, and
  wherein the motor coil member is disposed in the intermediate opening.

5. The substrate processing apparatus of claim 1, wherein, when the substrate stage moves in parallel with the first direction and is placed in a first location, the first driving unit moves the follower stage in parallel with the first direction such that the follower stage is placed in a location corresponding to the first location.

6. The substrate processing apparatus of claim 1, further comprising:
  a first guide frame that supports a side of the follower stage; and
  a second guide frame that supports an opposite side of the follower stage, wherein the second guide frame is spaced apart from the first guide frame in a second direction crossing the first direction.

7. The substrate processing apparatus of claim 6, wherein each of the first and second guide frames comprises:
  a guide portion that is elongated in the first direction and guides a movement of the follower stage;
  a first support portion that supports a side of the guide portion; and
  a second support portion that supports an opposite side of the guide portion, wherein the second support portion is spaced apart from the first support portion in the first direction.

8. The substrate processing apparatus of claim 7, further comprising:
  a first balance mass that moves in parallel with the first direction along the guide portion of the first guide frame; and
  a second balance mass that moves in parallel with the first direction along the guide portion of the second guide frame.

9. The substrate processing apparatus of claim 8, wherein each of the first and second balance masses comprises:
  a balance body that includes a first groove extending in the first direction;
  a motor magnet member that includes a second groove extending in the first direction, wherein the second groove is inserted into the first groove; and
  a motor coil member that is disposed on each of the first and second guide frames, wherein the motor coil member is inserted into the second groove.

10. The substrate processing apparatus of claim 8, wherein the first and second balance masses move in an opposite direction to that of the follower stage.

11. The substrate processing apparatus of claim 1, wherein the follower stage is not in contact with the substrate stage.

12. The substrate processing apparatus of claim 1, further comprising:
  a base frame;
  a gantry fixed to the base frame; and
  a moving stage unit that moves in parallel with the first direction between the base frame and the gantry,
  wherein the moving stage unit comprises the substrate stage and the follower stage.

* * * * *